(12) United States Patent
Zhang et al.

(10) Patent No.: US 11,980,070 B2
(45) Date of Patent: May 7, 2024

(54) DISPLAY PANEL AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bing Zhang, Beijing (CN); Shanghong Li, Beijing (CN); Mengyue Fan, Beijing (CN)

(73) Assignees: CHENGDU BOE OPTOELECTRONICS CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 447 days.

(21) Appl. No.: 17/281,013

(22) PCT Filed: Jun. 15, 2020

(86) PCT No.: PCT/CN2020/096093
§ 371 (c)(1),
(2) Date: Mar. 29, 2021

(87) PCT Pub. No.: WO2021/253156
PCT Pub. Date: Dec. 23, 2021

(65) Prior Publication Data
US 2022/0199740 A1   Jun. 23, 2022

(51) Int. Cl.
*H10K 59/131* (2023.01)
*H10K 50/80* (2023.01)
(Continued)

(52) U.S. Cl.
CPC ........... *H10K 59/131* (2023.02); *H10K 50/80* (2023.02); *H10K 59/10* (2023.02); *H10K 2102/311* (2023.02)

(58) Field of Classification Search
CPC ...... H10K 59/131; H10K 59/10; H10K 50/80; H10K 2102/311; G06F 3/041
See application file for complete search history.

(56) References Cited

U.S. PATENT DOCUMENTS

| 2018/0269261 A1* | 9/2018 | Park | H10K 50/844 |
| 2018/0277029 A1* | 9/2018 | Lee | G06F 3/0443 |

(Continued)

FOREIGN PATENT DOCUMENTS

| CN | 103984145 | 8/2014 |
| CN | 104916242 | 9/2015 |

(Continued)

OTHER PUBLICATIONS

PCT International Search Report for corresponding PCT Application No. PCT/CN2020/096093, 9 pages.

(Continued)

*Primary Examiner* — Kyoung Lee
*Assistant Examiner* — Christina A Sylvia
(74) *Attorney, Agent, or Firm* — Dority & Manning, P.A.

(57) ABSTRACT

A display panel has a display region and at least one bonding region located beside the display region. The display panel includes: a base; and a plurality of conductive pads provided on the base and located in each bonding region. The plurality of conductive pads are arranged at intervals along a first direction. The plurality of conductive pads include at least one first type of conductive pad configured to transmit a direct current voltage signal to the display region and a plurality of second type of conductive pads configured to transmit a pulse voltage signal to the display region. A dimension of one first type of conductive pad in the first direction is greater than a dimension of one second type of conductive pad in the first direction.

16 Claims, 6 Drawing Sheets

(51) Int. Cl.
*H10K 59/10* (2023.01)
*H10K 102/00* (2023.01)

(56) References Cited

U.S. PATENT DOCUMENTS

| | | | |
|---|---|---|---|
| 2020/0312205 A1* | 10/2020 | Shin | ............... G09G 3/006 |
| 2020/0333857 A1 | 10/2020 | Liu et al. | |
| 2021/0181559 A1 | 6/2021 | Li et al. | |
| 2021/0202684 A1 | 7/2021 | Gao et al. | |

FOREIGN PATENT DOCUMENTS

| | | |
|---|---|---|
| CN | 106019676 | 10/2016 |
| CN | 107369692 | 11/2017 |
| CN | 107490885 | 12/2017 |
| CN | 110794991 | 2/2020 |
| CN | 210323695 | 4/2020 |
| CN | 210605298 | 5/2020 |
| EP | 3279722 A1 | 2/2018 |
| KR | 20050058905 | 6/2005 |

OTHER PUBLICATIONS

Extended European Search Report for corresponding EP Application No. 20941468.9, dated Mar. 28, 2023, 8 pages.

\* cited by examiner

DISPLAY PANEL AND DISPLAY APPARATUS

CROSS-REFERENCE TO RELATED APPLICATION

This application is a national phase entry under 35 USC 371 of International Patent Application No. PCT/CN2020/096093 filed on Jun. 15, 2020, which is incorporated herein by reference in its entirety.

TECHNICAL FIELD

The present disclosure relates to the field of display technologies, and in particular, to a display panel and a display apparatus.

BACKGROUND

With advantages such as high brightness, full viewing angle, quick response and flexible display, organic light-emitting diodes (OLEDs) have been widely used in the display field.

SUMMARY

In an aspect, a display panel is provided. The display panel has a display region and at least one bonding region located beside the display region. The display panel includes: a base; and a plurality of conductive pads provided on the base and located in each bonding region. The plurality of conductive pads are arranged at intervals along a first direction. The plurality of conductive pads include at least one first type of conductive pad configured to transmit a direct current voltage signal to the display region and a plurality of second type of conductive pads configured to transmit a pulse voltage signal to the display region. A dimension of one first type of conductive pad in the first direction is greater than a dimension of one second type of conductive pad in the first direction.

In some embodiments, the dimension of the first type of conductive pad in the first direction is $W_1$, and the dimension of the second type of conductive pad in the first direction is $W_2$. $W_1$ is equal to n times $W_2$ ($W_1 = nW_2$), and n is any value greater than 1.

In some embodiments, n is an integer, the dimension of the first type of conductive pad in the first direction is less than a dimension of a region occupied by n second type of conductive pads in the first direction.

In some embodiments, the plurality of conductive pads extend along a second direction. Dimensions of the first type of conductive pad and the second type of conductive pad in the second direction are approximately equal. The first direction and the second direction intersect.

In some embodiments, the first direction and the second direction are non-perpendicular to each other.

In some embodiments, the at least one first type of conductive pad is configured to transmit at least one of a VDD (voltage drain drain) signal and a VSS (voltage source source) signal to the display region.

In some embodiments, in a same bonding region, one first type of conductive pad is configured to transmit a same kind of direct current voltage signal.

In some embodiments, the display panel further has at least one bendable region. The display panel is divided into a plurality of sub-display panels by the at least one bendable region. The at least one bonding region includes a plurality of bonding regions, and the plurality of bonding regions are arranged at an edge of the display panel perpendicular to an extending direction of the at least one bendable region. A sub-display panel has at least one bonding region, and bonding regions of the sub-display panels are all located at a same edge of the display panel.

In some embodiments, the sub-display panel has a plurality of bonding regions, a distance between the bendable region and a bonding region proximate to the bendable region is greater than a distance between two adjacent bonding regions of the plurality of bonding regions of the sub-display panel.

In another aspect, a display apparatus is provided. The display apparatus includes: the display panel according to any one of the above embodiments; and at least one COF (chip on film) bonded to the at least one bonding region of the display panel. The at least one COF includes a plurality of conductive pins that are respectively bonded to the plurality of conductive pads in the at least one bonding region and are arranged at intervals along the first direction. The plurality of conductive pins include: at least one first type of conductive pin electrically connected to the at least one first type of conductive pad of the plurality of conductive pads, and a plurality of second type of conductive pins respectively electrically connected to the plurality of second type of conductive pads of the plurality of conductive pads. A dimension of one first type of conductive pin in the first direction is larger than a dimension of one second type of conductive pin in the first direction.

In some embodiments, the dimension of the first type of conductive pin in the first direction is less than the dimension of the first type of conductive pad electrically connected to the first type of conductive pin in the first direction. The dimension of the second type of conductive pin in the first direction is less than the dimension of the second type of conductive pad electrically connected to the second type of conductive pin in the first direction.

In some embodiments, the plurality of conductive pins extend along a second direction. Dimensions of the first type of conductive pin and the second type of conductive pin in the second direction are approximately equal. The first direction and the second direction intersect.

In some embodiments, the display apparatus further includes: an anisotropic conductive adhesive provided between the at least one COF and the plurality of conductive pads. The at least one COF is electrically connected to the plurality of conductive pads through the anisotropic conductive adhesive.

In some embodiments, an included angle between the first direction and the second direction is 80°, 82°, or 84°.

BRIEF DESCRIPTION OF THE DRAWINGS

In order to describe technical solutions in the present disclosure more clearly, the accompanying drawings to be used in the description of some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, the accompanying drawings in the following description can be regarded as schematic diagrams, and are not limitations on actual dimensions of products and actual processes of methods involved in the embodiments of the present disclosure.

DETAILED DESCRIPTION

Figure 1:
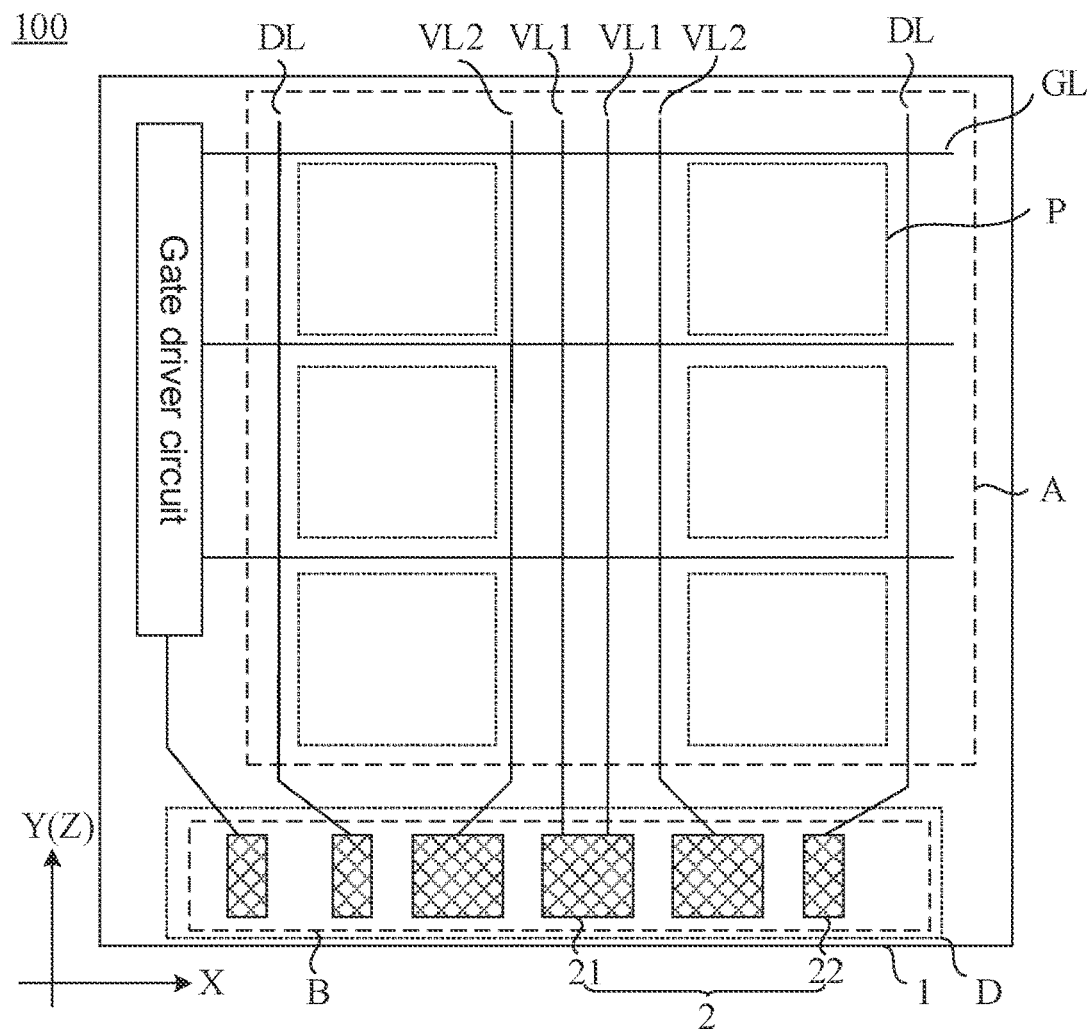
FIG. 1 is a structural diagram of a display panel according to some embodiments of the present disclosure.

The technical solutions in embodiments of the present disclosure will be described clearly and completely with reference to the accompanying drawings. Obviously, the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as being open and inclusive, meaning "including, but not limited to." In the description of the specification, the terms "one embodiment", "some embodiments", "exemplary embodiments", "an example" or "some examples" and the like are intended to indicate that specific features, structures, materials, or characteristics related to the embodiment or example are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Below, the terms "first" and "second" are used for descriptive purposes only and are not to be construed as indicating or implying the relative importance or implicitly indicating the number of indicated technical features. Thus, features defined as "first", "second" may explicitly or implicitly include one or more of the features. In the description of the embodiments of the present disclosure, "a plurality of/the plurality of" means two or more unless otherwise specified.

In describing some embodiments, "connected" and its derivative expressions may be used. For example, the term "connected" may be used when describing some embodiments to indicate that two or more components are in direct physical contact or electrical contact with each other. The embodiments disclosed herein are not necessarily limited to the content herein.

"At least one of A, B, and C" has the same meaning as "at least one of A, B, or C", and both include the following combinations of A, B, and C: only A, only B, only C, a combination of A and B, a combination of A and C, a combination of B and C, and a combination of A, B and C.

"A and/or B" includes the following three combinations: only A, only B, and a combination of A and B.

The use of "applicable to" or "configured to" herein means an open and inclusive expression, which does not exclude apparatuses that are applicable to or configured to perform additional tasks or steps.

In addition, the use of "based on" means openness and inclusiveness, since a process, step, calculation or other actions "based on" one or more of the stated conditions or values may be based on additional conditions or exceed the stated values in practice.

As used herein, "about" or "approximately" includes the stated value as well as the average value within the acceptable deviation range of the specified value, where the acceptable deviation range is determined by a person of ordinary skill in the art in consideration of the measurement in question and the error associated with the measurement of a specific quantity (i.e., the limitations of the measurement system).

Exemplary embodiments are described herein with reference to cross-sectional views and/or plan views as idealized exemplary drawings. In the accompanying drawings, the thickness of layers and regions are exaggerated for clarity. Therefore, variations in the shape with respect to the accompanying drawings due to, for example, manufacturing technology and/or tolerances are conceivable. Therefore, the exemplary embodiments should not be construed as being limited to the shape of the region shown herein, but include shape deviations due to, for example, manufacturing. For example, the etched region shown as a rectangle will generally have curved features. Therefore, the regions shown in the accompanying drawings are schematic in nature, and their shapes are not intended to show the actual shape of the region of the device, and are not intended to limit the scope of the exemplary embodiments.

With the development of full-screen technology, the screen-to-body ratio of an organic light-emitting diode (OLED) display apparatus is continuously increasing, leading to a narrower and narrower border region of a display panel in the OLED display apparatus.

In the related art, a bonding region is provided in a border region of the display panel, and a plurality of conductive pads (e.g., bonding pads) arranged at intervals in sequence are provided in the bonding region. The plurality of conductive pads are electrically connected to a plurality of signal lines of the display panel, and are bonded to a COF (chip on film, or chip on flex), so that the COF is able to transmit electrical signals to the plurality of signal lines through the plurality of conductive pads. Herein, different conductive pads may be electrically connected to different types of signal lines, so that the COF may transmit different types of electrical signals through different conductive pads. The different types of electrical signals may include, for example, a Data signal, a GOA (gate driver on array) signal, a VSS (voltage source source) signal and a VDD (voltage drain drain) signal.

In the related art, the plurality of conductive pads generally have a same or approximately same size, and two adjacent conductive pads have a same or approximately a same distance therebetween, so as to reduce a difficulty of a manufacturing process of the plurality of conductive pads, and to reduce a risk of bonding misalignment of the COF and the plurality of conductive pads.

In addition, due to a large number of signal lines of each type in the display panel, a number of conductive pads that are electrically connected to each type of signal lines is also large, which results in a large bonding resistance between the COF and the plurality of conductive pads that correspond to each type of signal lines. Herein, the bonding resistance may be a sum of resistances of a plurality of conductive pads corresponding to a same type of signal lines.

The different types of electrical signals transmitted by the COF may be roughly divided into two types according to types of voltages corresponding to the electrical signals, namely, a direct current voltage signal (for example, including the VSS signal and the VDD signal) and a pulse voltage signal (for example, including the Data signal and the GOA signal). When the COF transmits the DC voltage signal to a corresponding type of signal line, a problem of voltage drop (IR drop) occurs due to the above-mentioned large bonding resistance, which affects display effects of the display panel.

Figure 11:
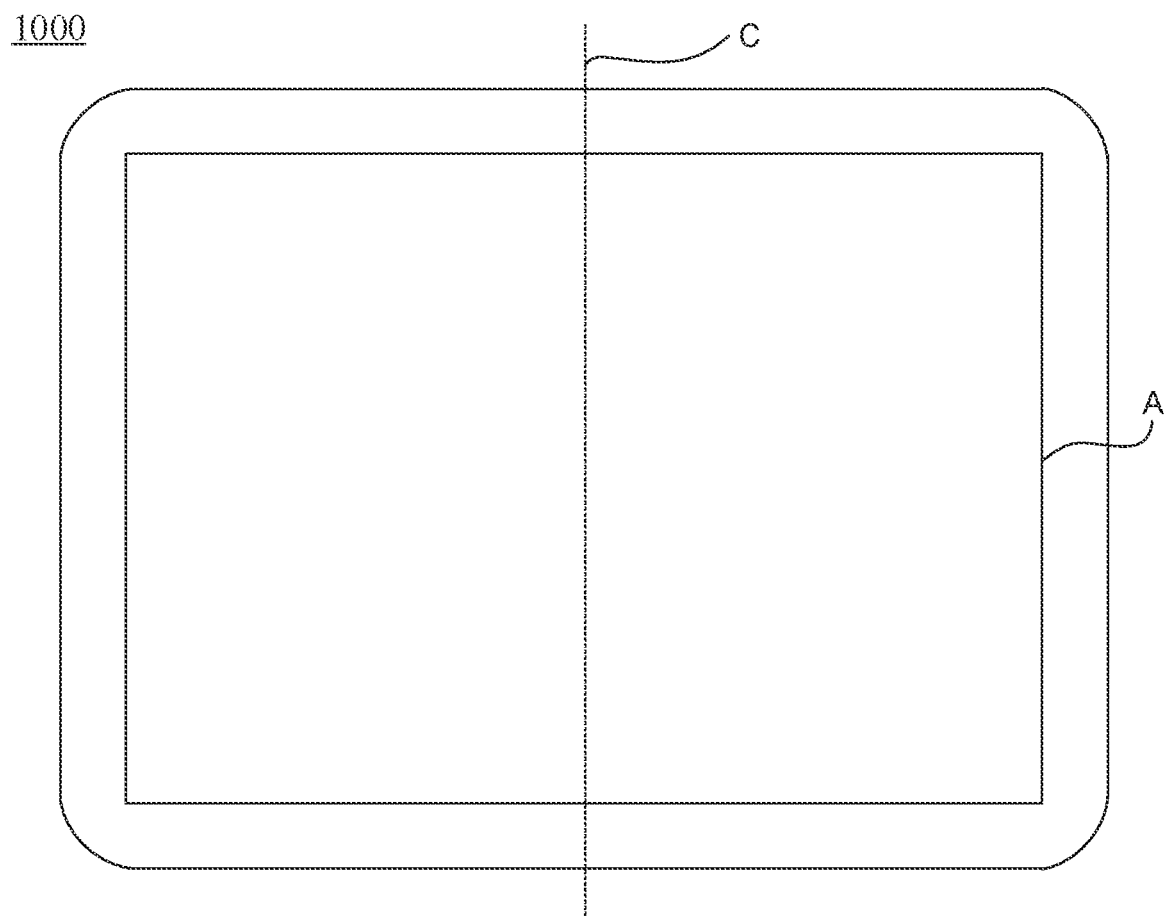
FIG. 11 is a structural diagram of another display apparatus according to some embodiments of the present disclosure.

Based on this, as shown in FIG. 11, some embodiments of the present disclosure provide a display apparatus 1000.

Figure 8:
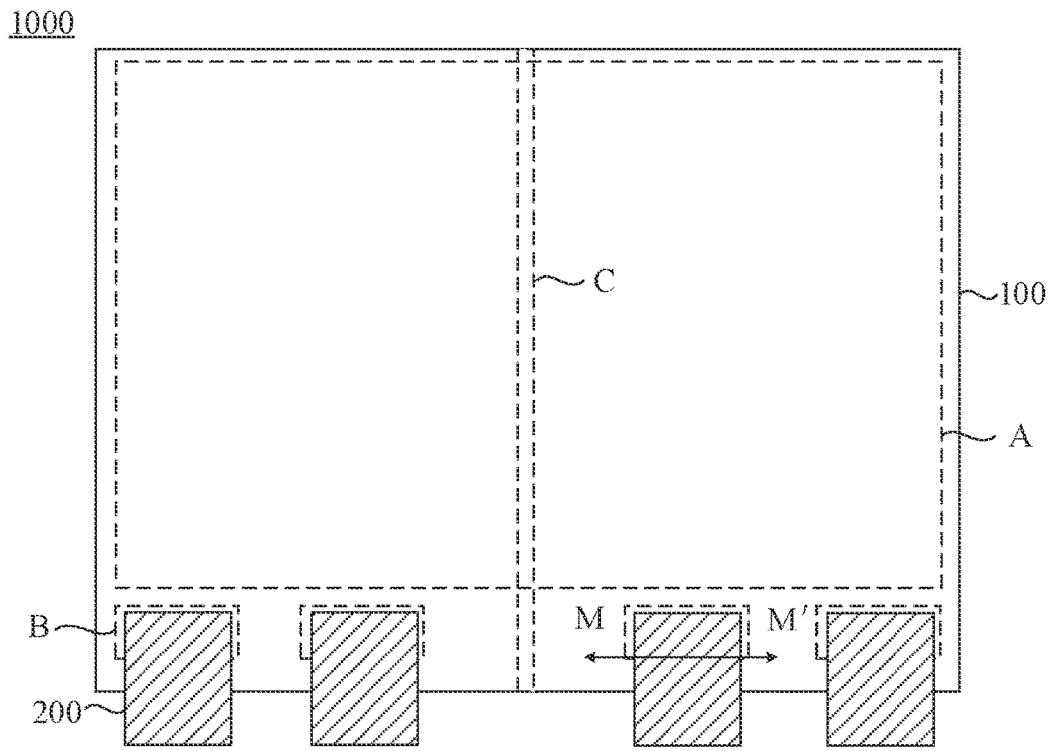
FIG. 8 is a structural diagram of a display apparatus according to some embodiments of the present disclosure.

In some examples, as shown in FIG. 8, the display apparatus 1000 includes a display panel 100. The display panel 100 has a display region A and at least one bonding region B located beside the display region A (for example, it may be located on one side, two sides, or peripheral sides of the display region A). That is, the display panel 100 may have one or more bonding regions B.

In some examples, as shown in FIG. 8, the display apparatus 1000 further includes at least one COF 200. The at least one COF is bonded to the at least one bonding region B of the display panel 100.

For example, in a case where the display panel 100 has a single bonding region B, the display apparatus 1000 may include a single COF 200 bonded to the bonding region B. The COF 200 may transmit electrical signals to the display region A through the bonding region B.

For example, in a case where the display panel 100 has a plurality of bonding regions B, the display apparatus 1000 may include a plurality of COFs 200. The plurality of COFs 200 may be, for example, bonded to the plurality of bonding regions B in one-to-one correspondence.

In this case, for example, the display panel 100 has a large size. In this case, the display region A of the display panel 100 may be divided into a plurality of sub-display regions, and each COF 200 can independently transmit electrical signals to a corresponding sub-display region through a corresponding bonding region B. The plurality of COFs 200 can transmit electrical signals to the display region A in cooperation with each other, so that the display panel 100 with a large size realizes an image display. Of course, part of the plurality of COFs 200 can transmit electrical signals to corresponding sub-display regions, so that a partial region of the display panel 100 realizes an image display.

A structure of the display panel 100 in the display apparatus 1000 provided by some embodiments of the present disclosure will be schematically described below in combination with the accompanying drawings.

As shown in FIG. 1, the display panel 100 provided by some embodiments of the present disclosure includes a base 1.

The base 1 may be of various structures, which may be set according to actual needs. For example, the base 1 is a blank base substrate. For another example, the base 1 includes a blank base substrate and a functional film (for example, a buffer layer) provided on the blank base substrate.

The blank base substrate is of various types, which may be set according to actual needs.

For example, the blank base substrate may be a rigid base substrate. The rigid base substrate may be, for example, a glass base substrate or a PMMA (polymethyl methacrylate) base substrate.

For another example, the blank base substrate may be a flexible base substrate. The flexible base substrate may be, for example, a PET (polyethylene terephthalate) base substrate, a PEN (polyethylene naphthalate) base substrate, or a PI (polyimide) base substrate.

In a case where the blank base substrate is the flexible base substrate, the display panel 100 may be a flexible display panel. The flexible display panel, for example, may be bent or folded, which may realize curved display or folding display (that is, the flexible display panel may realize display in a folded state).

In some embodiments, as shown in FIG. 1, the display panel 100 further includes a plurality of signal lines arranged on a side of the base 1. The plurality of signal lines are insulated from each other.

The plurality of signal lines is of various types. For example, as shown in FIG. 1, the plurality of signal lines may include: a plurality of gate lines GL extending along a first direction X, a plurality of data lines DL extending along a third direction Y, a plurality of first voltage signal lines VL1 extending along the third direction Y, and a plurality of second voltage signal lines VL2 extending along the third direction Y. Of course, the first voltage signal lines VL1 and the second voltage signal lines VL2 may also extend along the first direction X, which is not limited in this example.

In some examples, the first direction X and the third direction Y intersect.

A magnitude of an included angle between the first direction X and the third direction Y may be set according to actual needs. For example, the first direction X and the third direction Y may be perpendicular to each other. That is, the included angle between the first direction X and the third direction Y is 90°.

In some examples, as shown in FIG. 1, the plurality of gate lines GL and the plurality of data lines DL cross each other to define a plurality of sub-pixel regions P located in the display region A. The plurality of sub-pixel regions P are, for example, arranged in an array.

Figure 2:
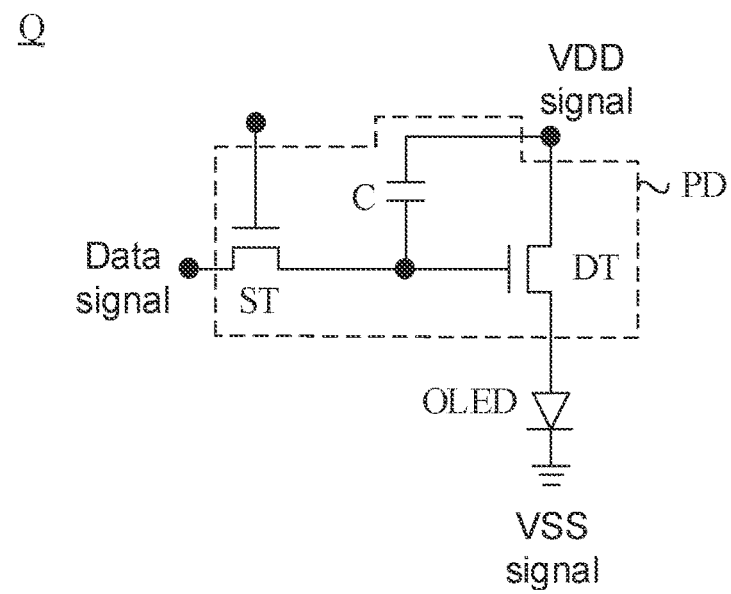
FIG. 2 is an equivalent circuit diagram of a sub-pixel according to some embodiments of the present disclosure.

In some embodiments, as shown in FIG. 2, the display panel 100 further includes a sub-pixel Q arranged in each sub-pixel region P.

For example, sub-pixels Q arranged in a row along the first direction X may be referred to as sub-pixels Q in a same row, and sub-pixels Q arranged in a column along the third direction Y may be referred to as sub-pixels Q in a same column. The sub-pixels Q in the same row may be electrically connected to one gate line GL, and the sub-pixels Q in the same column may be electrically connected to one data line DL.

In some examples, each sub-pixel Q may include: a pixel driving circuit PD provided on a side of the base 1, and an OLED provided on a side of the pixel driving circuit PD away from the base 1 and electrically connected to the pixel driving circuit PD.

In some examples, the pixel driving circuit PD may be composed of a plurality of thin film transistors (TFTs) and at least one capacitor (C). The plurality of TFTs include a driving transistor DT and at least one switching transistor ST.

In some examples, the pixel driving circuit PD is of various structures such as "2T1C", "6T1C", "7T1C", "6T2C", or "7T2C" structure. Herein, "T" represents a thin film transistor, and a number before "T" represents the number of thin film transistors; "C" represents a storage capacitor, and a number before "C" represents the number of storage capacitors.

For example, as shown in FIG. 2, the pixel driving circuit PD has a "2T1C" structure. The pixel driving circuit PD may be electrically connected to one gate line GL, one data line DL, one first voltage signal line VL1, and one second voltage signal line VL2. The gate line GL is configured to transmit a Gate signal to a corresponding sub-pixel Q; the data line DL is configured to transmit a Data signal to the corresponding sub-pixel Q; the first voltage signal line VL1 is configured to transmit a VDD signal to the corresponding sub-pixel Q, and the second voltage signal line VL2 is configured to transmit a VSS signal to the corresponding sub-pixel Q.

By transmitting the various electrical signals to each sub-pixel Q, but not limited to transmitting the above-mentioned electrical signals, it may be possible to control a light-emitting state of each OLED, and thus the display panel 100 can display images.

In some embodiments, as shown in FIG. 1, the display panel 100 further includes a plurality of conductive pads 2 arranged on the base 1 and located in each bonding region B. Herein, in the case where the base 1 includes the blank base substrate and the functional film provided on the blank base substrate, the plurality of conductive pads 2 may be provided on a side of the functional film away from the blank base substrate.

In some examples, the plurality of conductive pads 2 in each bonding region B are bonded to a corresponding COF 200, and are electrically connected to a plurality of signal lines. In this way, the COF 200 can transmit various electrical signals to the plurality of signal lines through the corresponding plurality of conductive pads 2. The gate lines GL among the plurality of signal lines may be electrically connected to a corresponding conductive pad 2 through a gate driver circuit. The gate driver circuit can convert a GOA signal transmitted by the COF 200 into a Gate signal, and transmit the Gate signal to the gate line GL, so as to reduce a number of the conductive pads 2, and to reduce a dimension of the bonding region B in the first direction X.

Figure 3:
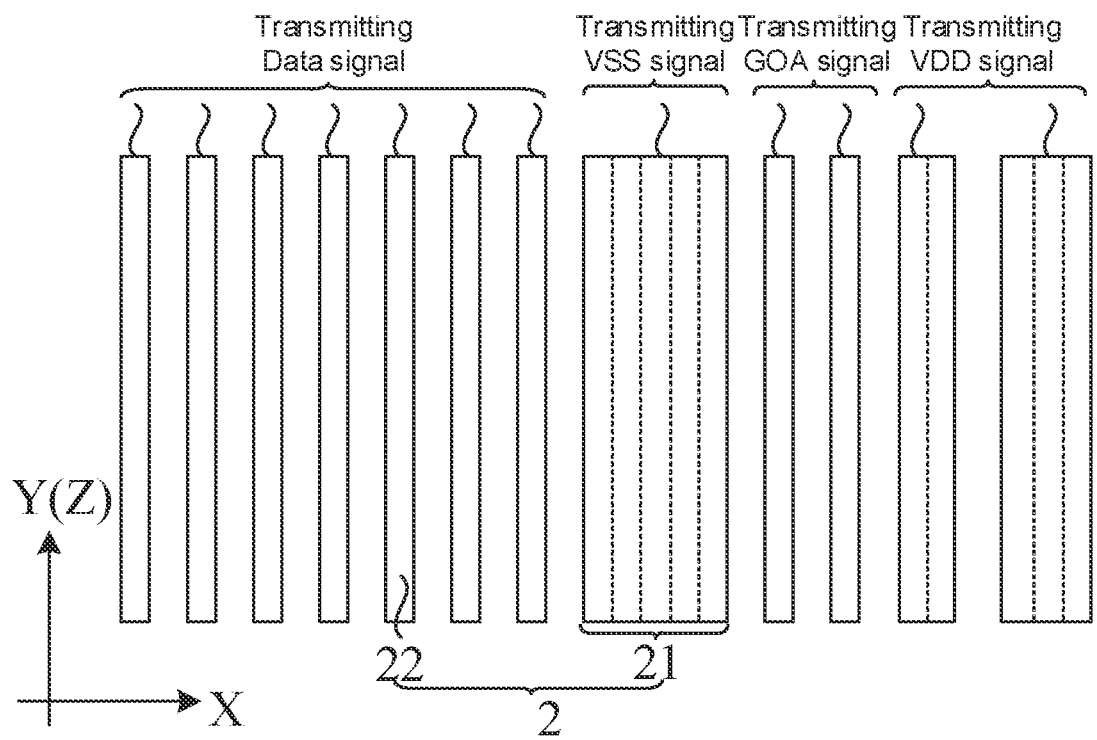
FIG. 3 is an enlarged view of a region D of the display panel shown in FIG. 1.
Figure 4:
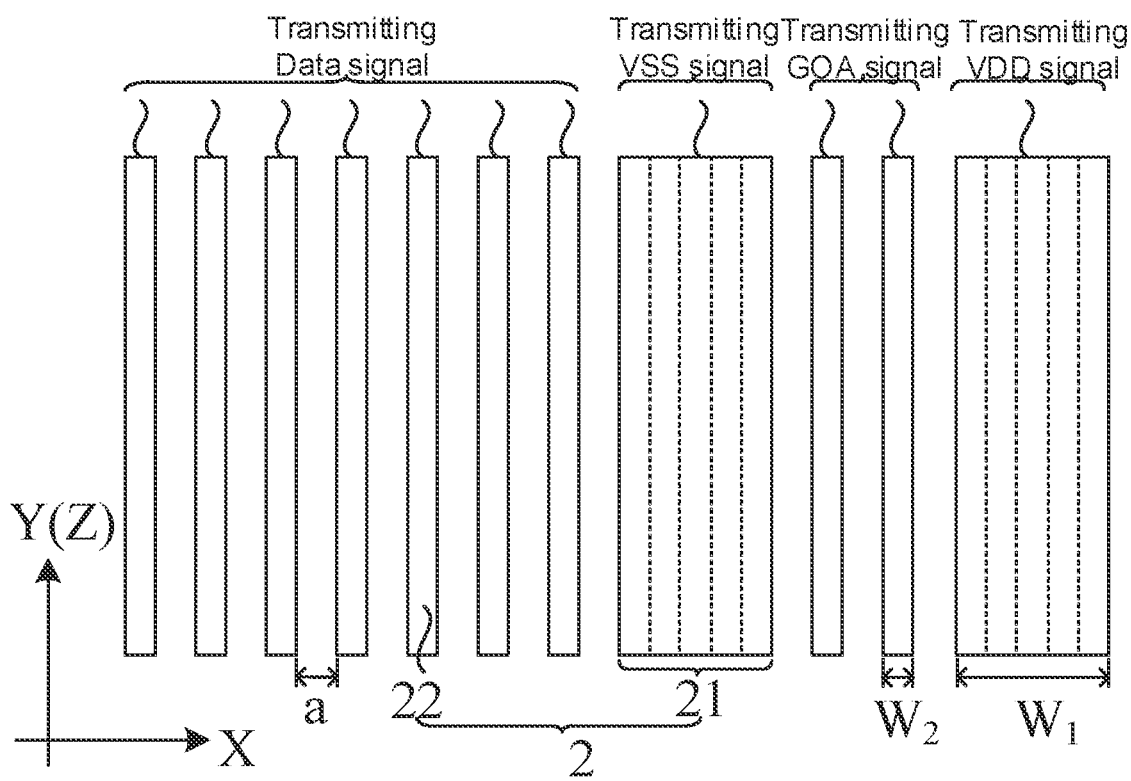
FIG. 4 is another enlarged view of the region D of the display panel shown in FIG. 1.
Figure 5:
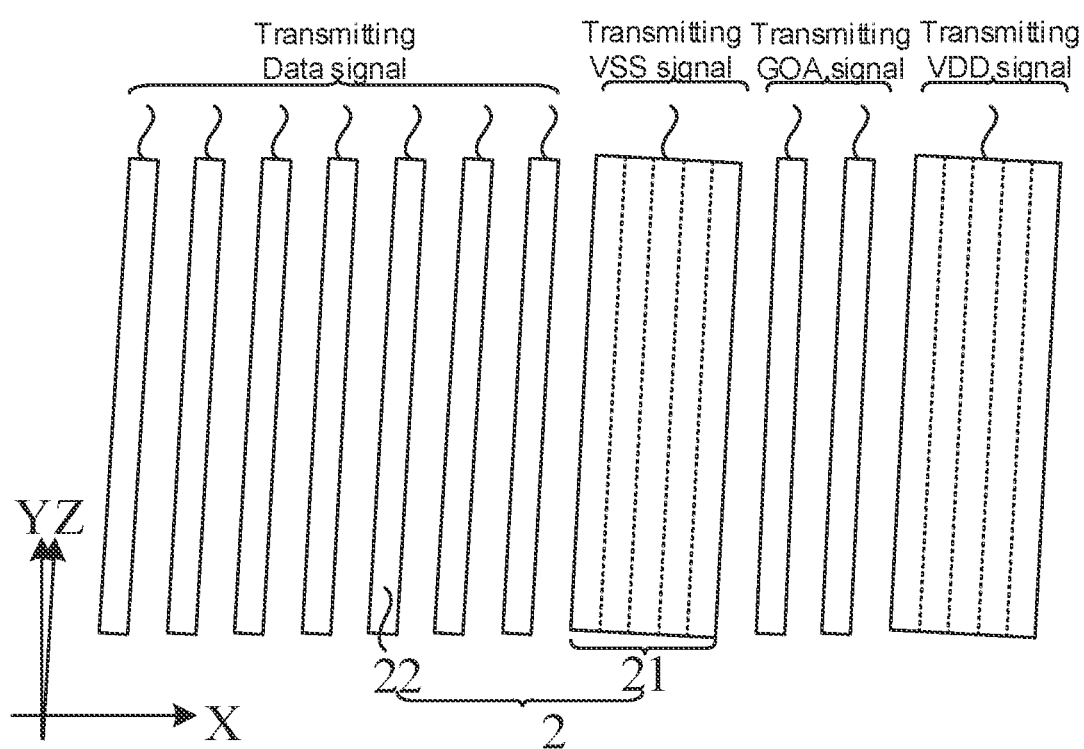
FIG. 5 is yet another enlarged view of the region D of the display panel shown in FIG. 1.

In some embodiments, as shown in FIGS. 3 to 5, the plurality of conductive pads 2 are arranged at intervals along the first direction X, and extend along a second direction Z.

For example, each conductive pad 2 may be in a shape of a strip. That is, a shape of an orthographic projection of the conductive pad 2 on the base 1 may be a rectangle, and a dimension of the rectangle in the second direction Z is greater or much greater than a dimension thereof in the first direction X.

In this way, it is beneficial for simplifying a wiring of each conductive pad 2. Moreover, a dimension of each bonding region B in the first direction X may be reduced, which is beneficial for realizing a narrow border of the display panel 100.

In addition, by arranging the plurality of conductive pads 2 at intervals along the first direction X, it may be possible to insulate every two adjacent conductive pads 2 from each other, to avoid short-circuiting two adjacent conductive pads 2, and thus avoid electrical signal transmission errors (for example, an error where the Gate signal is transmitted to the first voltage signal line VL1 due to a short circuit of two adjacent conductive pads 2).

For example, distances between every two adjacent conductive pads 2 are equal or approximately equal. That is, the plurality of conductive pads 2 are arranged at equal intervals, which is beneficial to simplify a wiring of the signal lines in the display panel 100.

In some examples, as shown in FIG. 1 and FIGS. 3 to 5, the first direction X and the second direction Z intersect.

A magnitude of an included angle between the first direction X and the second direction Z may be set according to actual needs.

For example, as shown in FIG. 1 and FIGS. 3 and 4, the first direction X and the second direction Z may be perpendicular to each other. That is, the included angle between the first direction X and the second direction Z is 90°.

For another example, as shown in FIG. 5, the first direction X and the second direction Z may not be perpendicular to each other. That is, the included angle between the first direction X and the second direction Z may not be equal to 90°. The included angle between the first direction X and the second direction Z may be, for example, 80°, 82°, 84°, etc., which is beneficial to reduce an alignment adjustment accuracy in bonding the COF 20 to the plurality of conductive pads 20.

In some embodiments, a relationship between the second direction Z and the third direction Y may be various, which may be set according to actual needs.

In some examples, as shown in FIGS. 1, 3, and 4, the second direction Z and the third direction Y may be parallel to each other. That is, an extending direction of the plurality of conductive pads 2 included in the display panel 100 is same or substantially same as an extending direction of the plurality of signal lines.

In some other examples, as shown in FIG. 5, the second direction Z and the third direction Y may intersect each other. That is, the extending direction of the plurality of conductive pads 2 included in the display panel 100 is different from the extending direction of the plurality of signal lines, and there is an included angle between the two. A magnitude of the included angle may be set according to actual needs.

In some examples, as shown in FIG. 1 and FIGS. 3 to 5, the plurality of conductive pads 2 include at least one first type of conductive pad 21 configured to transmit a direct current voltage signal to the display region A and a plurality of second type of conductive pads 22 configured to transmit a pulse voltage signal to the display region A.

For example, the direct current voltage signal includes at least one of the VDD signal and the VSS signal. That is, the at least one first type of conductive pad 21 is configured to transmit at least one of the VDD signal and the VSS signal to the display region A. Herein, in a case where both the VDD signal and the VSS signal are transmitted by the at least one first type of conductive pad 21, a number of the first type of conductive pads 21 is at least two.

Of course, in a case where the direct current voltage signal further includes other types of direct current voltage signals, the at least one first type of conductive pad 21 may be further configured to transmit those types of direct current voltage signals to the display region A, which is not limited in the embodiments of the present disclosure.

For example, the pulse voltage signal includes the GOA signal, the Data signal, and the like. That is, the plurality of second type of conductive pads 22 are configured to transmit the GOA signal, the Data signal, and the like.

In some examples, as shown in FIG. 1 and FIGS. 3 to 5, a dimension of the first type of conductive pad 21 in the first direction X is greater than a dimension of the second type of conductive pad 22 in the first direction X.

It will be noted that, in a case where a dimension of the conductive pad 2 in the second direction Z is constant, a resistance (for example, a line resistance) of the conductive pad 2 is inversely proportional to a dimension of the conductive pad 2 in the first direction X. That is, the less the dimension of the conductive pad 2 in the first direction X is, the greater the resistance of the conductive pad 2 is; the greater the dimension of the conductive pad 2 in the first direction X is, the less the resistance of the conductive pad 2 is.

For example, in a case where the shape of the orthographic projection of the conductive pad 2 on the base 1 is the rectangle, the dimension of the conductive pad 2 in the first direction X may be a dimension of the conductive pad 2 at any position thereof in the first direction. In a case where the shape of the orthographic projection of the conductive pad 2 on the base 1 is an irregular shape (for example, an ellipse), the dimension of the conductive pad 2 in the first direction X may be an average dimension of the conductive pad 2 at different positions thereof in the first direction. Herein, some examples of the present disclosure are schematically illustrated by taking an example in which the shape of the orthographic projection of the conductive pad 2 on the base 1 is the rectangle.

By setting the dimension of the first type of conductive pad 21 in the first direction X to be greater than the dimension of the second type of conductive pad 22 in the first direction X, it may be possible to adjust a resistance of the first type of conductive pad 21, for example, to reduce the resistance of the first type of conductive pad 21.

Therefore, in the display panel 100 provided by some embodiments of the present disclosure, it may be possible to reduce the resistance of the first type of conductive pad 21 by dividing the plurality of conductive pads 2 into the at least one first type of conductive pad 21 that transmits the direct current voltage signal and the plurality of second type of conductive pads 22 that transmit the pulse voltage signal according to the types of electrical signals transmitted by the plurality of conductive pads 2, and by setting the dimension of the first type of conductive pads 21 in the first direction X to be greater than the dimension of the second type of conductive pad 22 in the first direction X. When the COF 200 is bonded to the conductive pads 2, a contact area between the COF 200 and the at least one first type of conductive pad 21 may be increased, so as to reduce a bonding resistance between the COF 200 and the at least one first type of conductive pad 21. In this way, it may be possible to effectively alleviate the IR drop problem caused by the bonding resistance and thus improve the display effects of the display panel 100.

It will be noted that, in some examples, the first voltage signal line VL1 and/or the second voltage signal line VL2 electrically connected to the first type of conductive pad 21, and the data line DL electrically connected to the second type of conductive pad 22, etc., may be located in different layers to avoid a problem of short circuits caused by crossed wires.

In some embodiments, as shown in FIG. 1 and FIGS. 3 to 5, dimensions of the first type of conductive pad 21 and the second type of conductive pad 22 in the second direction Z are equal or approximately equal.

In this way, it is beneficial to simplify the wiring of the conductive pad 2, and to simplify the manufacturing process of the conductive pads 2. In addition, it is further beneficial to ensure that a shape of the bonding region B is regular, and to reduce an area of the bonding region B, so as to realize the narrow border of the display panel 100.

In some embodiments, as shown in FIG. 4, the dimension of the first type of conductive pad 21 in the first direction X is $W_1$, and the dimension of the second type of conductive pad 22 in the first direction X is $W_2$. $W_1$ is equal to n times $W_2$ ($W_1=nW_2$), and n is any value greater than 1. Herein, a maximum value of n may be a number of conductive pads that transmit a same electrical signal as the first type of conductive pad 21 in one bonding region of the display panel. As for display panels of different sizes, the maximum value of n may be different. For example, the number of the conductive pads that transmit the same electrical signal as the first type of conductive pad 21 in one bonding region of the display panel is 5. In this case, n may be any value between 1 and 5 (excluding 1). For example, n may be 1.2, 1.5, 2, 2.5, 3, 4, or 5.

In this way, the resistance of the first type of conductive pad 21 may be effectively reduced, the IR drop problem may be effectively alleviated, and the display effects of the display panel 100 may be effectively improved. In addition, by quantifying the relationship between $W_1$ and $W_2$, it may be possible to facilitate a fabrication of the first type of conductive pad 21 and the second type of conductive pad 22.

It can be understood that, the conductive pads that transmit different types of electrical signals in the related art have the same or approximately same dimension. In some embodiments of the present disclosure, the relationship between the dimension of the first type of conductive pad 21 in the first direction X and the dimension of the second type of conductive pad 22 in the first direction X is set to be that $W_1$ is equal to n times $W_2$ ($W_1=nW_2$). It may be understood as that each first type of conductive pad 21 is formed by forming n conductive pads that transmit a same kind of direct current voltage signal into an integrative structure. Further, it may be understood as that each first type of conductive pad 21 is formed by forming n structures having a same dimension as the second type of conductive pad 22 into an integrative structure.

In some embodiments, as shown in FIGS. 3 to 5, in a case where n is an integer, the dimension of the first type of conductive pad 21 in the first direction X is less than a dimension of a region occupied by n second type of conductive pads 22 in the first direction X.

For example, as shown in FIG. 4, n may be 5. That is, each first type of conductive pad 21 may be formed by forming five structures having the same dimension as the second type of conductive pad 22 into an integrative structure. In this case, the dimension of the first type of conductive pad 21 in the first direction X is equal to $5W_2$. Since every two adjacent second type of conductive pads 22 have a distance a therebetween, the dimension of the region occupied by five second type of conductive pads 22 in the first direction X is equal to a sum of $5W_2$ and 4a (i.e., $5W_2+4a$). Thus, a difference between the dimension of the first type of conductive pad 21 in the first direction X and the dimension of the region occupied by the n second type of conductive pads 22 in the first direction X is a sum of distances between every two adjacent second type of conductive pads 22 of the n second type of conductive pads 22.

In this way, it is beneficial to reduce the dimension of the bonding region B in the first direction X, and to reduce the area of the bonding region B, and thereby helping to realize the narrow border of the display panel 100. In addition, in the case where the display panel 100 has the plurality of bonding regions B, a distance between two adjacent bonding regions B may be increased, so as to provide a space for arranging the COF 200 that is bonded to the plurality of conductive pads 2 in the bonding region B.

In some embodiments, in a same bonding region B, as the dimensions of the first type of conductive pads 21 in the first direction X progressively increases, the number of the first type of conductive pads 21 progressively decreases.

In this way, it may be possible to avoid increasing the dimension of the bonding region B in the first direction X, and to avoid reducing the distance between two adjacent bonding regions B on the premise of increasing the contact area between the first type of conductive pad 21 and the COF 200 and reducing the resistance of the first type of conductive pad 21.

In some embodiments, as shown in FIGS. 4 and 5, in a same bonding region B, one first type of conductive pad is configured to transmit a same kind of direct current voltage signal.

For example, in the same bonding region B, one first type of conductive pad 21 is configured to transmit the VDD signal, and/or one first type of conductive pad 21 is configured to transmit the VSS signal.

This means that, all conductive pads in a same bonding region B that are configured to transmit a same kind of direct current voltage signal can be formed into an integrative structure, which constitutes one first type of conductive pad 21 in the embodiments of the present disclosure. This is beneficial to further increase the contact area between the first type of conductive pad 21 and the COF 200, to further reduce the resistance of the first type of conductive pad 21, and to further effectively alleviate the IR drop problem caused by the bonding resistance, and to improve the display effects of the display panel 100. In addition, the area of the bonding region B may be further reduced to realize the narrow border of the display panel 100. In the case where the display panel 100 has the plurality of bonding regions B, the distance between two adjacent bonding regions B may be further increased, so as to provide a large space for arranging the COF 200 that is bonded to the plurality of conductive pads 2 in the bonding region B.

In some embodiments, a structure of the plurality of conductive pads 2 included in the display panel 100 and connection relationships between the plurality of conductive pads 2 and the plurality of signal lines may be various, which may be set according to actual needs.

For example, the data lines DL, the first voltage signal lines VL1, and the second voltage signal lines VL2 among the plurality of signal lines may be arranged in a same layer.

In some examples, the plurality of conductive pads 2 may be arranged in a same layer as the gate lines GL among the plurality of signal lines.

In this case, among the plurality of conductive pads 2, part of conductive pads 2 that are electrically connected to the gate lines GL may be integrated with the corresponding gate lines GL. Among the plurality of conductive pads 2, part of conductive pads 2 may be electrically connected to the data lines DL, the first voltage signal lines VL1 and the second voltage signal lines VL2 through vias.

In some other examples, the plurality of conductive pads 2 may include a part arranged in a same layer as the gate lines GL and a part arranged in a same layer as the data lines DL.

In this case, among the part of conductive pads 2 that are electrically connected to the gate lines GL, the part arranged in the same layer as the gate lines GL and the corresponding gate lines GL may be formed into an integrative structure. Among the part of conductive pads 2 that are electrically connected to the data lines GL, the first voltage signal lines VL1, and the second voltage signal lines VL2, the part arranged in the same layer as the data lines DL may be arranged in a same layer as the corresponding data lines DL, the corresponding first voltage signal lines VL1, and the corresponding second voltage signal lines VL2, respectively.

It will be noted that the "same layer" mentioned in this article refers to a layer structure that is formed through a single patterning process using a same mask after a film for forming specific patterns is formed using a same film forming process. Depending on different specific patterns, the single patterning process may include a multiple exposure process, a development process or an etching process, and the specific patterns in the formed layer structure may be continuous or discontinuous, and the specific patterns may be at different heights or have different thicknesses. In this way, a plurality of structures arranged in a same layer may be formed simultaneously, which is beneficial to simplify the manufacturing process of the display panel 100.

Figure 6:
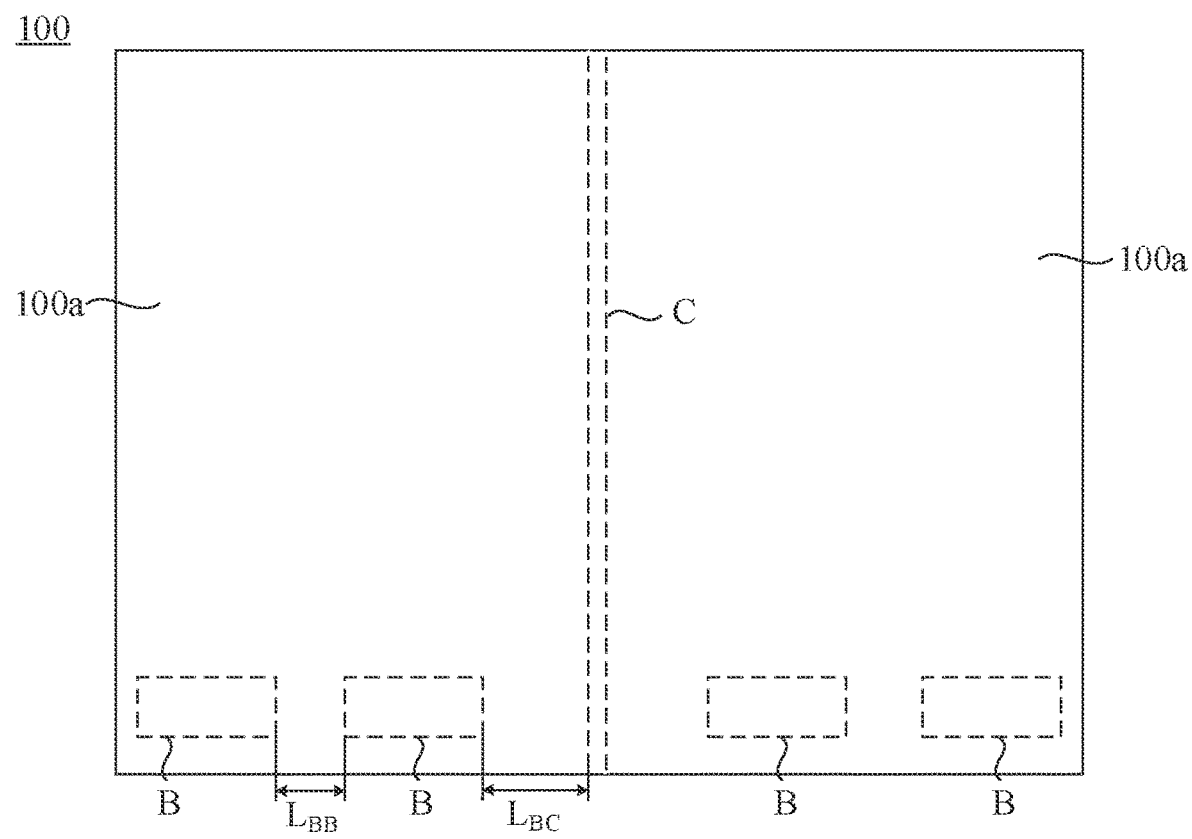
FIG. 6 is a structural diagram of another display panel according to some embodiments of the present disclosure.
Figure 7:
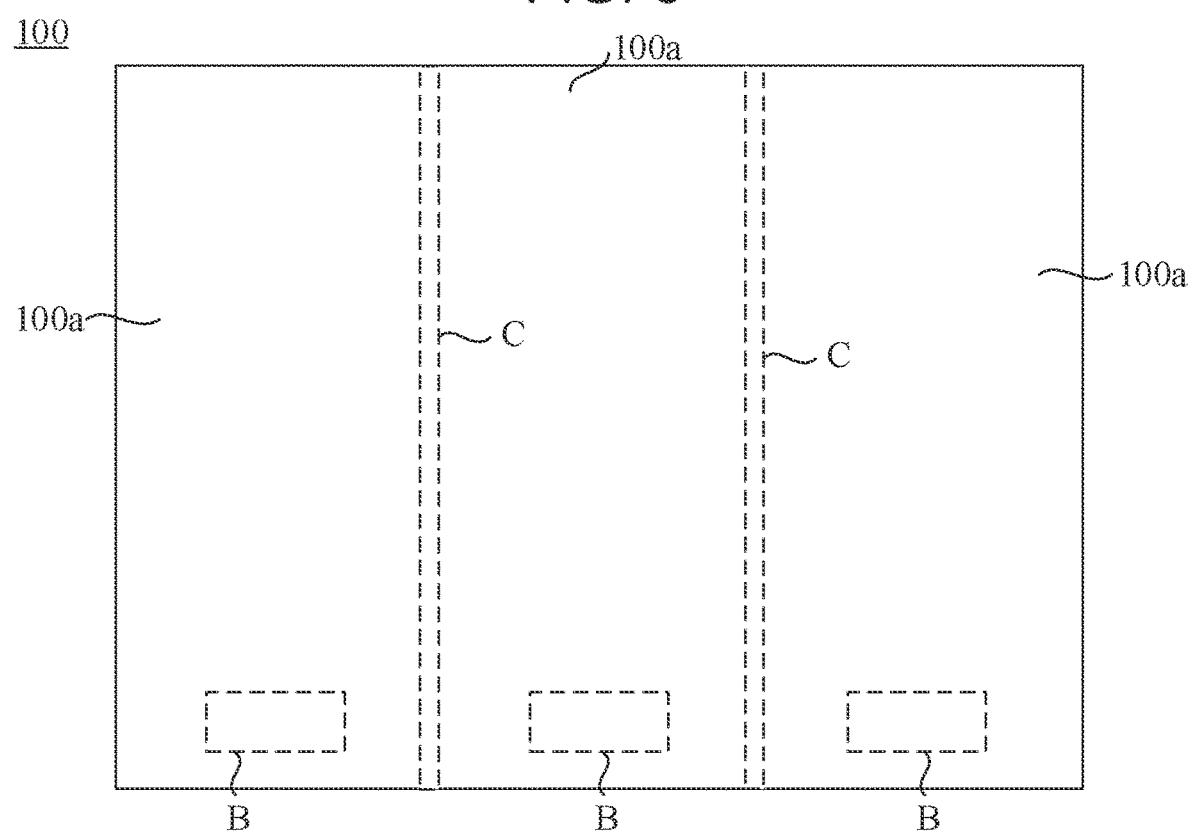
FIG. 7 is a structural diagram of yet another display panel according to some embodiments of the present disclosure.

In some embodiments, as shown in FIGS. 6 and 7, the display panel 100 has at least one bendable region C. The display panel 100 is divided into a plurality of sub-display panels 100a by the at least one bendable region C.

For example, as shown in FIG. 6, the display panel 100 has one bendable region C. The one bendable region C may be located, for example, in the middle of the display panel 100. In this case, the display panel 100 is divided into two sub-display panels 100a by the one bendable region C. The two sub-display panels 100a can rotate around the bendable region C to realize a foldable function of the display panel 100, so that the display panel 100 is easy to carry.

For example, as shown in FIG. 7, the display panel 100 has two bendable regions C. In this case, the display panel 100 is divided into three sub-display panels 100a by the two bendable regions C. The three sub-display panels 100a can rotate around the bendable regions C to realize the foldable function of the display panel 100, so that the display panel 100 is easy to carry.

Based on this, in some examples, the display panel 100 may have a plurality of bonding regions B, and each sub-display panel 100a may have at least one bonding region B. Each sub-display panel 100a may have one or more bonding regions B.

For example, the COFs 200 bonded to the bonding regions B can simultaneously transmit electrical signals to the sub-display panels 100a, so that the plurality of sub-display panels 100a can simultaneously display images. Of course, among the COFs 200 bonded to the bonding regions B, it can also be that only part of the COFs 200 transmit electrical signals to corresponding sub-display panels 100a, so that part of the sub-display panels 100a display images.

In some examples, as shown in FIGS. 6 and 7, considering the structure and manufacturing process of the display panel 100, the plurality of bonding regions B may be arranged at an edge of the display panel 100 perpendicular to an extending direction of the bendable region C. The bonding regions B of the sub-display panels 100a are located at a same edge of the display panel 100.

In this way, an arrangement of the bonding regions B may be uniform, which is convenient for planning an overall wiring structure of the display panel 100. Therefore, it may be possible to avoid a decrease of an area of the display region A due to a non-uniform arrangement of the bonding regions B, so as to realize the narrow border of the display panel 100.

In addition, in some embodiments of the present disclosure, by adjusting the dimension of the first type of conductive pad 21 in the first direction X, it may be possible to reduce the dimension of the bonding region B in the first direction X, thereby increasing the distance between two adjacent bonding regions B and a distance between the bendable region C and a bonding region B proximate to the bendable region C. In this way, when the COF 200 is bonded to the bonding region B, a distance between the COF 200 and the bendable region C may be increased to bypass the bendable region C, so as to prevent a force generated in a process of folding the sub-display panels 100a from adversely affecting the COF 200 and the bonding between the COF 200 and the conductive pads 2 in the bonding region B, thereby avoiding affecting the transmission of the electrical signal in the sub-display panels 100a.

It will be noted that in a process of bonding the COF 200 to the bonding region B, a hot pressing process may be used for bonding. By increasing the distance between two adjacent bonding regions B, it may be possible to prevent an equipment (for example, pressure head) with a high temperature used in the hot pressing process from affecting the performance of adjacent COFs 200.

In some embodiments, as shown in FIG. 6, in a case where the sub-display panel 100a has the plurality of bonding regions B, the distance $L_{BC}$ between the bendable region C and the bonding region B proximate to the bendable region C is greater than the distance $L_{BB}$ between two adjacent bonding regions B of the plurality of bonding regions B of the sub-display panel 100a.

By setting a relationship between $L_{BC}$ and $L_{BB}$, it may be possible to ensure that $L_{BC}$ has a large value, thereby ensuring that the distance between the COF 200 and the bendable region C has a large value. In this way, it may be possible to prevent the force generated in the process of folding the sub-display panels 100a from adversely affecting the COF 200 and the bonding between the COF 200 and the conductive pads 2 in the bonding region B.

A structure of the COF 200 in the display apparatus 1000 provided by some embodiments of the present disclosure will be schematically described below in combination with the accompanying drawings.

Figure 9:
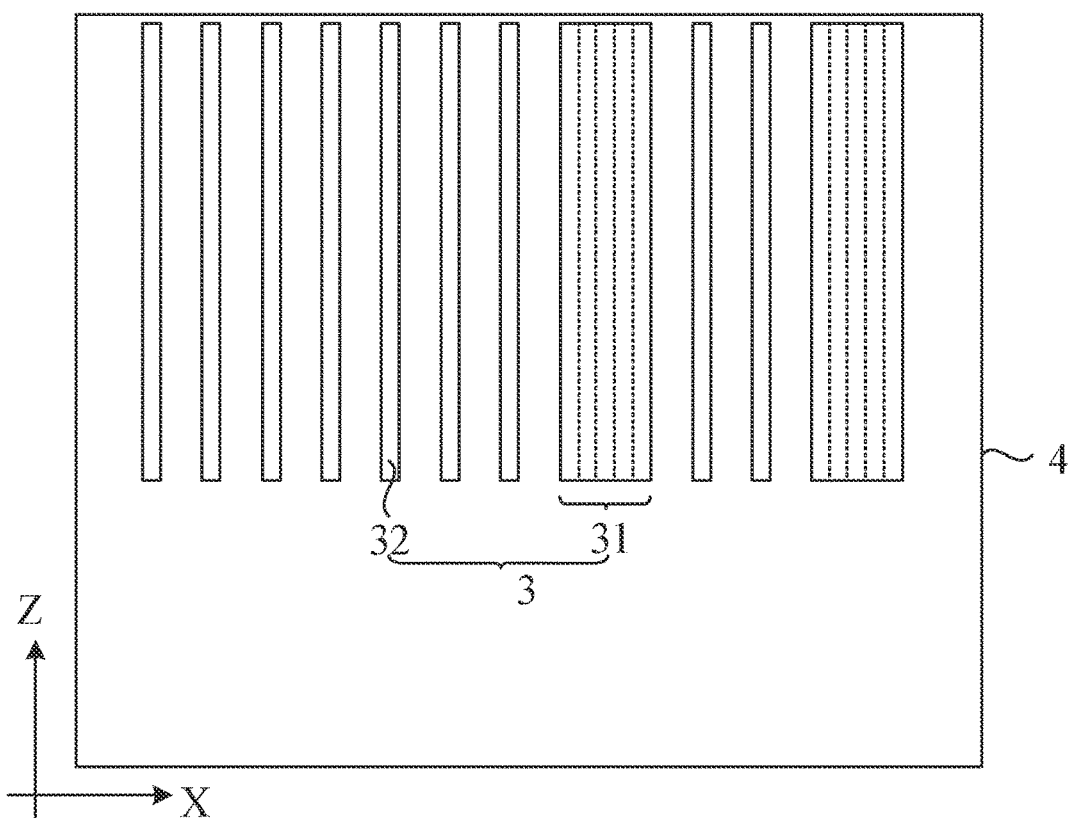
FIG. 9 is a structural diagram of a COF according to some embodiments of the present disclosure.

In some embodiments, as shown in FIG. 9, each COF 200 includes a plurality of conductive pins 3 that are respectively bonded to the plurality of conductive pads 2 in a corresponding bonding region B and are arranged at intervals along the first direction X, and a flexible circuit board 4 carrying the plurality of conductive pins.

In some examples, distances between the plurality of conductive pins 3 are equal or approximately equal. That is, the plurality of conductive pins 3 are arranged at equal intervals. This helps to reduce a difficulty of alignment and calibration when bonding the COF 200 and the plurality of conductive pads 2.

Figure 10:
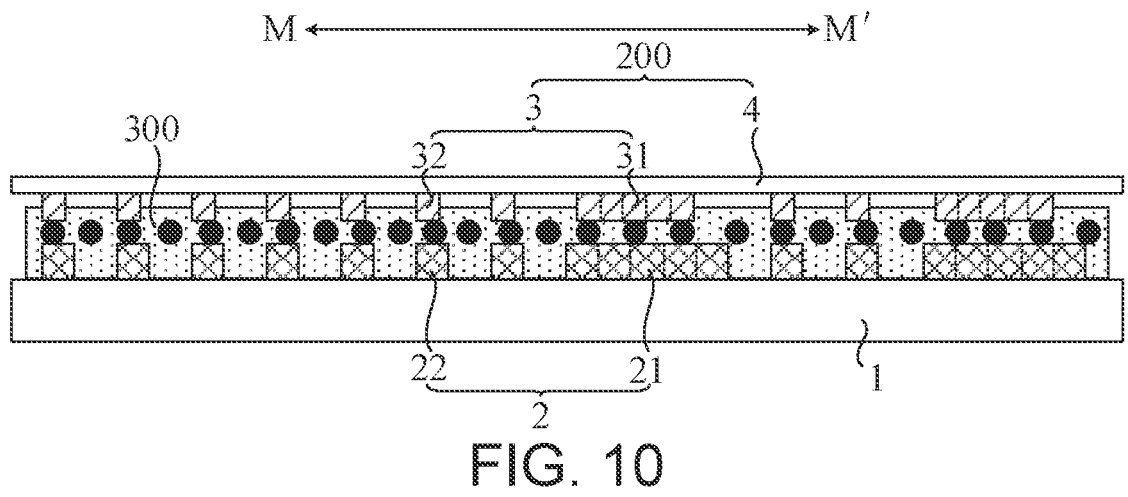
FIG. 10 is a cross-sectional view of the display apparatus shown in FIG. 8 taken along an M-M' direction.

In some examples, as shown in FIG. 10, the plurality of conductive pins 3 include at least one first type of conductive pin 31 electrically connected to the at least one first type of conductive pad 21 of the plurality of conductive pads 2, and a plurality of second type of conductive pins 32 respectively electrically connected to the plurality of second type of conductive pads 22 of the plurality of conductive pads 2.

For example, the plurality of conductive pins 3 and the plurality of conductive pads 2 are electrically connected in one-to-one correspondence. That is, the at least one first type of conductive pin 31 and the at least one first type of conductive pad 21 may be of a same number and may be electrically connected in one-to-one correspondence, and the plurality of second type of conductive pins 32 and the plurality of second type of conductive pads 22 may be of a same number and may be electrically connected in one-to-one correspondence.

In this way, the COF 200 can transmit the electrical signals to the display region A of the display panel 100 through the conductive pins 3 and the conductive pads 2 corresponding to the conductive pins 3, so that the display panel 100 can realize display images.

In some examples, as shown in FIG. 9, the plurality of conductive pins 3 extend along the second direction Z. That is, an extending direction of the plurality of conductive pins 3 is same or substantially same as that of the plurality of conductive pads 2.

This helps to ensure that each conductive pin 3 is only electrically connected to a corresponding conductive pad 2, and avoids electrical connection errors between the conductive pins 3 and the conductive pads 2 (for example, an error where the conductive pin 3 that transmits the Gate signal is electrically connected to both the conductive pad 2 that transmits the Gate signal and the conductive pad 2 that transmits the Data signal).

In some examples, as shown in FIG. 9, dimensions of the first type of conductive pin 31 and the second type of conductive pin 32 in the second direction Z are equal or approximately equal. In this way, shapes of regions occupied by the first type of conductive pin 31 and the second type of conductive pin 32 may be regular, so that the first type of conductive pin 31 and the second type of conductive pin 32 may occupy a small area of the COF 200. Therefore, it may be possible to prevent the area of the COF 200 from being increased due to an existence of the first type of conductive pin 31 and the second type of conductive pin 32.

In some examples, as shown in FIG. 9, a dimension of the first type of conductive pin 31 in the first direction X is greater than a dimension of the second type of conductive pin 32 in the first direction X.

On the basis of increasing the dimension of the first type of conductive pad 21 in the first direction X, by increasing the dimension of the first type of conductive pin 31 in the first direction X, when the COF 200 is bonded to the bonding region B, it may be ensured that each first type of conductive pin 31 and a corresponding first type of conductive pad 21 have a large contact area therebetween.

It will be noted that, in some examples of the present disclosure, each first type of conductive pin 31 may also be understood as being formed by forming n conductive pins that transmit a same kind of direct current voltage signal into an integrative structure.

Therefore, in the display apparatus 1000 provided by some embodiments of the present disclosure, by increasing the dimension of the first type of conductive pad 21 in the first direction X to reduce the resistance of the first type of conductive pad 21, and by increasing the dimension of the first type of conductive pin 31 in the COF 200 that is electrically connected to the first type conductive pad 21 in the first direction X, it may be possible to effectively ensure that each first type of conductive pin 31 and the corresponding first type of conductive pad 21 have a large contact area therebetween. In this way, when the COF 200 transmits the electrical signal, the VDD signal and/or the VSS signal with less loss can be transmitted to the display region A of the display panel 100, which effectively alleviates the IR drop problem caused by the bonding resistance, and improves the display effects of the display apparatus 1000.

In some examples, as shown in FIG. 10, the dimension of the first type of conductive pin 31 in the first direction X is less than the dimension of the first type of conductive pad 21 electrically connected to the first type of conductive pin in the first direction X, and the dimension of the second type of conductive pin 32 in the first direction X is less than the dimension of the second type of conductive pad 22 electrically connected to the second type of conductive pin in the first direction X.

This helps to reduce the requirements on the alignment adjustment accuracy in bonding the COF 200 to the bonding region B, to reduce a difficulty of alignment in bonding the COF 200 to the bonding region B, and to improve an accuracy of an electrical connection between each conductive pin 3 and a corresponding conductive pad 2. That is, even if a size of misalignment between the COF 200 and the bonding region B is large, it may be still possible to ensure that each conductive pin 3 is electrically connected to a corresponding conductive pad 2, and to prevent an electrical connection from being formed between each conductive pin 3 and a conductive pad 2 adjacent to the corresponding conductive pad 2.

In some embodiments, as shown in FIG. 10, the display apparatus 1000 further includes an anisotropic conductive adhesive 300 provided between the COF 200 and the plurality of conductive pads 2 in a corresponding bonding region B. The COF 200 is electrically connected to the plurality of conductive pads 2 through the anisotropic conductive adhesive 300.

In some examples, the anisotropic conductive adhesive 300 includes an adhesive material and a plurality of conductive particles arranged in the adhesive material, and the plurality of conductive particles are arranged in an array in the adhesive material. After the anisotropic conductive adhesive 300 is used to form an electrical connection between the COF 200 and the plurality of conductive pads 2 in the bonding region B, the plurality of conductive particles are still arranged in the array.

Since contact areas between the plurality of conductive pads 2 and the plurality of conductive pins 3 of the COF 200 are inconsistent, by using the anisotropic conductive adhesive 300 to form the electrical connection between the COF 200 and the plurality of conductive pads 2 in the bonding region B, it may be possible to prevent such problems as short circuiting, overlapping, and small conduction area caused by an uneven distribution or an aggregation of the conductive particles from adversely affecting the electrical connection between the COF 200 and the plurality of conductive pads 2 in the bonding region B.

In some embodiments, the display apparatus 1000 may be a mobile phone, a tablet computer, a television, a monitor, a laptop, a foldable laptop, a digital photo frame, a navigator, or any other product or component having a display function.

The foregoing descriptions are merely some specific implementation manners of the present disclosure, but the protection scope of the present disclosure is not limited thereto. Any person skilled in the art could conceive of changes of replacements within the technical scope disclosed by the present disclosure, which shall all be included in the protection scope of the present disclosure. Therefore, the protection scope of the present disclosure shall be subject to the protection scope of the claims.

What is claimed is:

1. A display panel having a display region and at least one bonding region located beside the display region, the display panel comprising:
    a base; and
    a plurality of conductive pads provided on the base and located in each bonding region, the plurality of conductive pads being arranged at intervals along a first direction, and the plurality of conductive pads including at least one first type of conductive pad configured to transmit a direct current voltage signal to the display region and a plurality of second type of conductive pads configured to transmit a pulse voltage signal to the display region;
    wherein a dimension of one first type of conductive pad in the first direction is greater than a dimension of one second type of conductive pad in the first direction;
    the display panel further has at least one bendable region;
    the display panel is divided into a plurality of sub-display panels by the at least one bendable region;
    the at least one bonding region includes a plurality of bonding regions, and the plurality of bonding regions are arranged at an edge of the display panel perpendicular to an extending direction of the at least one bendable region;
    a sub-display panel has at least one bonding region, and bonding regions of the sub-display panels are all located at a same edge of the display panel.

2. The display panel according to claim 1, wherein the dimension of the first type of conductive pad in the first direction is $W_1$, and the dimension of the second type of conductive pad in the first direction is $W_2$, wherein $W_1$ is equal to n times $W_2$ ($W_1=nW_2$), and n is any value greater than 1.

3. The display panel according to claim 2, wherein n is an integer, the dimension of the first type of conductive pad in the first direction is less than a dimension of a region occupied by n second type of conductive pads in the first direction.

4. The display panel according to claim 2, wherein the plurality of conductive pads extend along a second direction;
    a dimension of the first type of conductive pad in the second direction is approximately equal to a dimension of the second type of conductive pad in the second direction; and
    the first direction and the second direction intersect.

5. The display panel according to claim 4, wherein the first direction and the second direction are non-perpendicular to each other.

6. The display panel according to claim 1, wherein the plurality of conductive pads extend along a second direction;
    a dimension of the first type of conductive pad in the second direction is approximately equal to a dimension of the second type of conductive pad in the second direction; and
    the first direction and the second direction intersect.

7. The display panel according to claim 6, wherein the first direction and the second direction are non-perpendicular to each other.

8. The display panel according to claim 7, included angle between the first direction and the second direction is 80°, 82°, or 84°.

9. The display panel according to claim 1, wherein the at least one first type of conductive pad is configured to transmit at least one of a VDD (voltage drain drain) signal and a VSS (voltage source source) signal to the display region.

10. The display panel according to claim 9, wherein in a same bonding region, one first type of conductive pad is configured to transmit a same kind of direct current voltage signal.

11. The display panel according to claim 1, wherein the sub-display panel has a plurality of bonding regions, a distance between the bendable region and a bonding region proximate to the bendable region is greater than a distance between two adjacent bonding regions of the plurality of bonding regions of the sub-display panel.

12. A display apparatus, comprising:
the display panel according to claim 1; and
at least one COF (chip on film) bonded to the at least one bonding region of the display panel;
wherein the at least one COF includes a plurality of conductive pins that are respectively bonded to the plurality of conductive pads in the at least one bonding region and are arranged at intervals along the first direction;
the plurality of conductive pins include:
at least one first type of conductive pin electrically connected to the at least one first type of conductive pad of the plurality of conductive pads, and a plurality of second type of conductive pins respectively electrically connected to the plurality of second type of conductive pads of the plurality of conductive pads;
a dimension of one first type of conductive pin in the first direction is greater than a dimension of one second type of conductive pin in the first direction.

13. The display apparatus according to claim 12, wherein the dimension of the first type of conductive pin in the first direction is less than the dimension of the first type of conductive pad electrically connected to the first type of conductive pin in the first direction; and
the dimension of the second type of conductive pin in the first direction is less than the dimension of the second type of conductive pad electrically connected to the second type of conductive pin in the first direction.

14. The display apparatus according to claim 13, wherein the plurality of conductive pins extend along a second direction; and
a dimension of the first type of conductive pin in the second direction is approximately equal to a dimension of the second type of conductive pin in the second direction; and
the first direction and the second direction intersect.

15. The display apparatus according to claim 12, wherein the plurality of conductive pins extend along a second direction; and
a dimension of the first type of conductive pin in the second direction is approximately equal to a dimension of the second type of conductive pin in the second direction; and
the first direction and the second direction intersect.

16. The display apparatus according to claim 12, further comprising an anisotropic conductive adhesive provided between the at least one COF and the plurality of conductive pads;
wherein the at least one COF is electrically connected to the plurality of conductive pads through the anisotropic conductive adhesive.

\* \* \* \* \*